United States Patent

Chu et al.

[11] Patent Number: 6,006,764
[45] Date of Patent: Dec. 28, 1999

[54] METHOD OF STRIPPING PHOTORESIST FROM AL BONDING PADS THAT PREVENTS CORROSION

[75] Inventors: Po-Tao Chu, Hsin-Chu; Ching-Wen Cho, Chu-Shan; Chia-Hung Lai, Taichung; Chih-Chien Hung, Hsin-Chu, all of Taiwan

[73] Assignee: Taiwan Semiconductor Manufacturing Company, Ltd., Hsin-Chu, Taiwan

[21] Appl. No.: 08/789,239

[22] Filed: Jan. 28, 1997

[51] Int. Cl.[6] .................................................. H01L 21/302
[52] U.S. Cl. ........................... 134/1.2; 134/1.3; 438/720; 438/723; 438/704; 438/725
[58] Field of Search ...................... 134/1.2, 1.3; 438/725, 438/704, 723, 720; 216/57, 77

[56] References Cited

U.S. PATENT DOCUMENTS

| | | | |
|---|---|---|---|
| 5,202,291 | 4/1993 | Charvat et al. | 437/245 |
| 5,378,653 | 1/1995 | Yanagida | 437/194 |
| 5,399,236 | 3/1995 | Ha et al. | 156/643 |
| 5,451,293 | 9/1995 | Tabara | 216/13 |
| 5,468,686 | 11/1995 | Kawamoto | 437/229 |
| 5,599,743 | 2/1997 | Nakagawa et al. | 437/194 |
| 5,700,740 | 12/1997 | Chen et al. | 438/710 |

*Primary Examiner*—Benjamin Utech
*Assistant Examiner*—George Goudreau
*Attorney, Agent, or Firm*—George O. Saile; Stephen B. Ackerman; William J. Stoffel

[57] ABSTRACT

The present invention provides a method of removing photoresist from a wafer surface having a bonding pad using a three step clean composed of (1) a wet cleaning the substrate, (2) a F-containing gas high temperature plasma treatment which prevents the corrosion of aluminum contact pad, and (3) completely striping the photoresist strip using an $O_2$ dry ash. The invention eliminates metal bonding pad corrosion and the completely removes residual photoresist from keyholes.

17 Claims, 6 Drawing Sheets

METHOD OF STRIPPING PHOTORESIST FROM AL BONDING PADS THAT PREVENTS CORROSION

BACKGROUND OF THE INVENTION

1). Field of the Invention

This invention relates generally to the fabrication of semiconductor devices and particularly to a method of striping photoresist from a passivation layer over metal lines and more particularly to a F-containing gas passivation treatment of bonding pad after a dry etch of a passivation layer overlying the bonding pad.

2). Description of the Prior Art

This invention relates to the prevention of metal corrosion after dry etches. Two manufacturing processes which have metal corrosion problems are the patterning of passivation layers over bonding pad formations and the patterning of metal lines. These two problems are explained below.

First, metal bonds are formed to metal bonding pads in a top metal layer on a semiconductor chip. This occurs after the chip has completed the fabrication process. It is usually assembled into a package to be utilized on a printed circuit board as part of a larger circuit. In order for the inner leads of the package to make electrical contact with the bonding pads of the chip, a metal bond is formed at the bonding pad of the chip with a lead extending to the inner lead of the package lead frame.

Figure 1A:
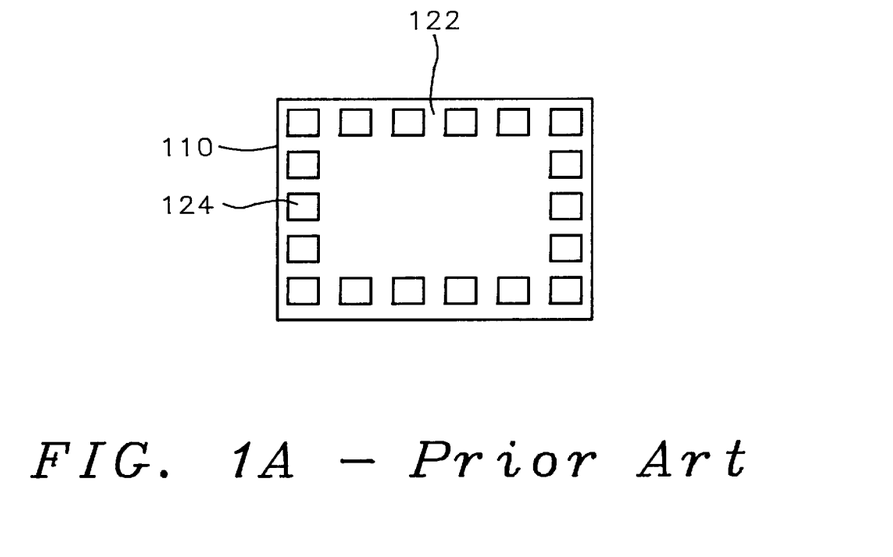
FIG. 1A is a top plan view of a bonding pad area on a substrate according to the prior art.
Figure 1B:
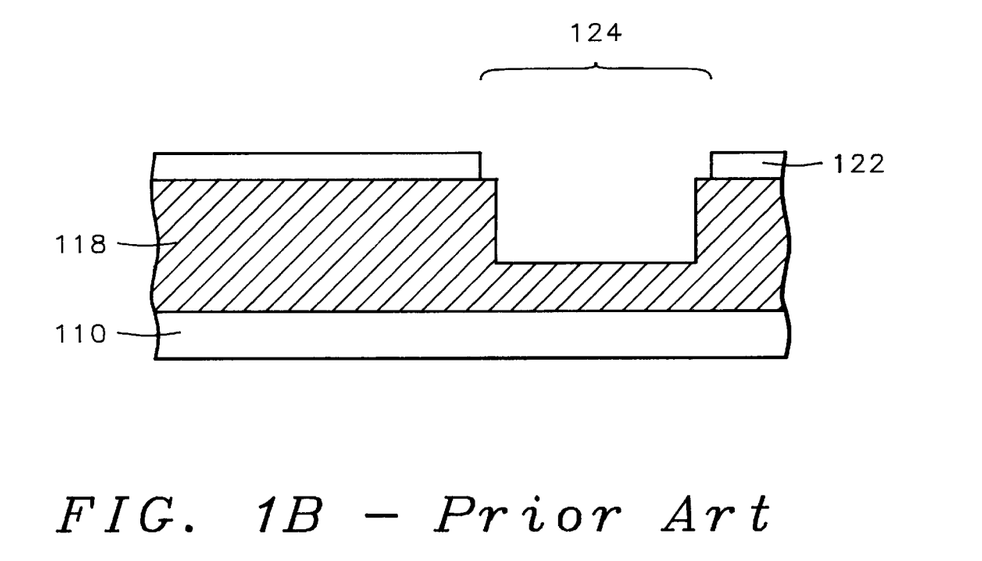
FIG. 1B is a cross sectional view of a bonding pad area of the prior art.

FIGS. 1A and 1B show a conventional bond pad area. A top metal layer 118 is formed over a top dielectric layer over a semiconductor substrate 110. The top metal layer is then etched to form metal lines. Bonding pad areas 124 are then etched into the top metal layer using conventional photolithographic processes. A passivation layer 122 is formed over a top metal layer 118. The passivation layer 122 can be formed of silicon oxide. The passivation layer is patterned using a photolithography and a dry etch process to form an opening over the bond pad area 124. We have encountered a corrosion problem of the top metal layer 188 in the bonding pad area after the dry etch of the passivation layer 122. Next, a metal bond is formed in the bonding pad area. The metal corrosion creates fails.

Figure 2:
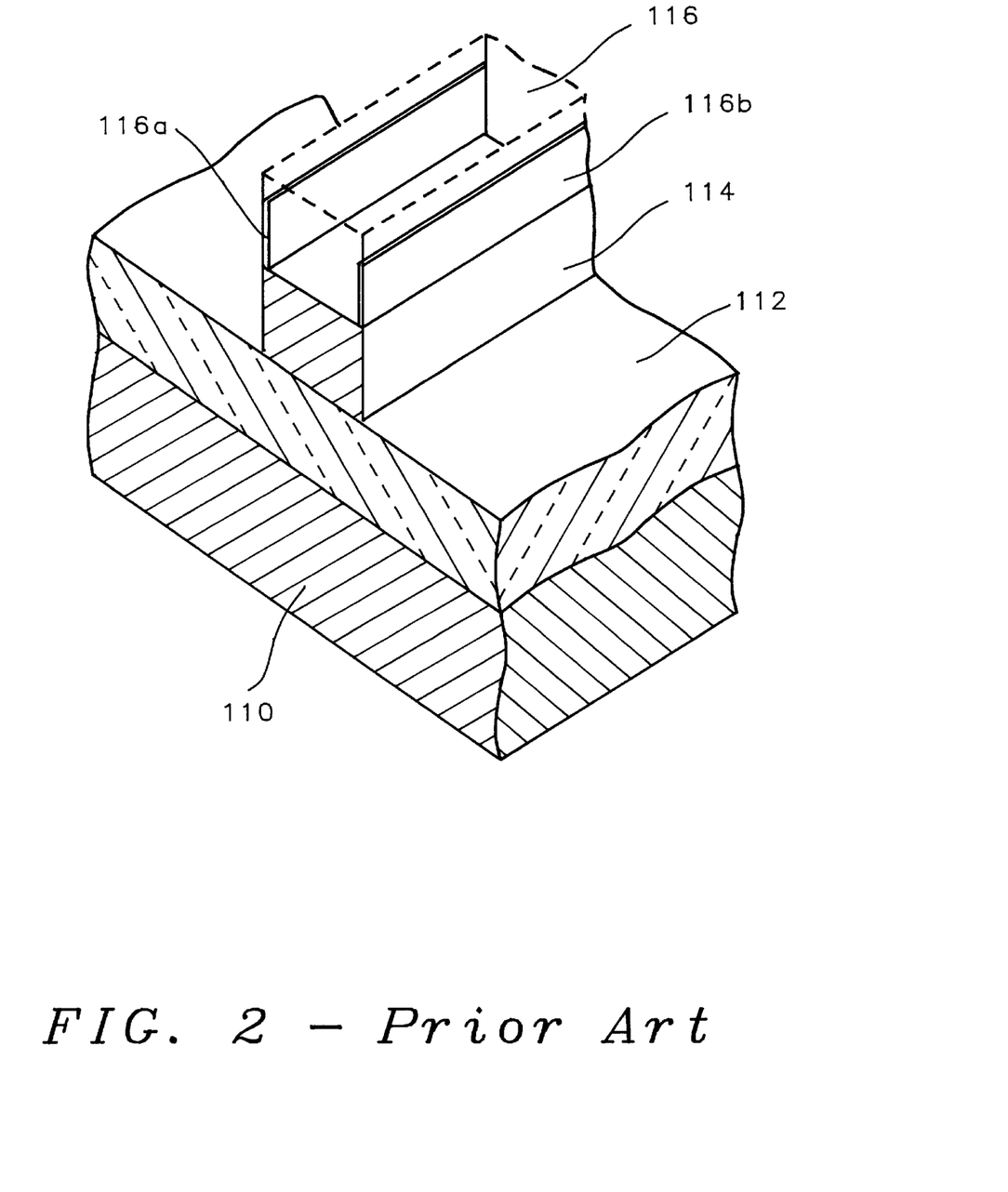
FIG. 2 is a cross sectional view of a process for striping photoresist from a wiring layer according to the prior art process.

Second, another corrosion problem occurs when patterning metal lines after an etch. A conventional method of making wiring layer for VLSI devices or the like is shown in FIG. 2 is known. An aluminum (Al) based wiring material layer, i.e. Al or Al alloy is deposited on an insulating film 112 covering the surface of a semiconductor substrate 110. Thereafter, a resist layer 16 is formed thereon and patterned in a desired layout. Using the resist layer 116 as a mask, the Al based wiring material layer is selectively etched by using a Cl based gas.

Thereafter, the resist layer 16 and etch by-products generated during the etching process are removed. Normally, an dry ashing process is used. The ashing process is performed using under plasma assisted conditions where an oxygen radical generated in the plasma reacts with organic material included in the resist materials. Thereby, the resist materials are oxidized and resolved. The photoresist removal process has been performed by two methods. First, photoresist ashing removal process is performed by an ashing process using a mixed gas of a fluorine (F) containing gas and an $O_2$ gas. The second method performed the ashing by using a plasma of a mixed gas, which contains hydrogen and oxygen (a H and O containing gas), such as $CH_3OH$ and an $O_2$ gas.

The first process (F and $O_2$) cannot remove Cl components sufficiently, which have attached during the etching process on the surface of the wafer. The unremoved Cl components may corrode a wiring. For a laminated layer having a barrier metal layer, such as TiW under the Al based wiring material layer, there are not only unremoved Cl components but also local batteries formed by the layers. This corrosion can more likely occur.

The second process ($H_2O$) is an improved version of the first process. With the second method, however, it is necessary to heat a substrate or wafer to about 250 to 350° C. in order to obtain a practical ashing speed. This heating process alters the quality of and cures, the resist surface in which the etching gas and by-product (such as $AlCl_x$, $CuCl_2$, $SiCl_x$) have been mixed. As shown in FIG. 2, resist surface layers of the resist film 116, particularly resist surface layer 116A and 116B, which are sometimes called rabbit ears, may be left unremoved.

Although the resist surface layers 116A and 116B may also be left unremoved when using the first method, theses layers can be readily washed out by amine based solvent. However, with the second method, the quality change and curing of the resist surface layer reached sometimes to the extent that the surface layer cannot be removed even if it is processed by amine based solvent, thereby lowering the manufacturing yield.

Others have attempted to solve aluminum corrosion problems after etching Al lines. The most pertinent appear to be, U.S. Pat. No. 5,202,291 (Charvat et al.) teaches a method of etching Al using a high $CF_4$ RIE. The patent shows the replacement of Cl with a carbonaceous species. U.S. Pat. No. 5,468,686 (Kawamoto) teaches a method of etching aluminum on a wafer with a Halogen gas and then cleaning the wafer and chamber with an oxygen containing gas. U.S. Pat. No. 5,451,293 (Tabara) teaches a method of ashing a photoresist layer using H and O containing gas with a F containing gas. U.S. Pat. No. 5,378,653(Yanagida) and U.S. Pat. No. 5,399,236 (Ha et al) show methods of reducing aluminum corrosion caused by $Cl_2$.

SUMMARY OF THE INVENTION

It is an object of the present invention to provide a method to remove photoresist from and around a metal pad contact that eliminates metal corrosion problems.

It is another object of the present invention to provide a method removing photoresist from and around a metal pad contact using a wet strip and a dry strip (e.g., $O_2$ ash) process that eliminates metal corrosion problems.

It is another object of the present invention to provide a method removing photoresist from around a metal pad contact using a three step strip process (wet strip, F-containing gas plasma treatment, and a dry $O_2$ ash strip process) that eliminates metal corrosion problems.

It is an object of the present invention to provide a method of cleaning a semiconductor substrate prior to an photoresist strip (e.g., $O_2$ ashing) process by using a F-containing gas passivation (high temperature) treatment and preventing the corrosion of aluminum contact pads.

It is an object of the present invention to provide a method of cleaning a semiconductor substrate after a metal patterning etch and prior to an photoresist strip (e.g., $O_2$ ashing) process by using a F-containing gas passivation (high temperature) treatment.

To accomplish the above objectives, the present invention provides a method of cleaning a semiconductor substrate prior to an photoresist strip ($O_2$ ashing) process by using a F-containing gas passivation treatment and preventing the corrosion of aluminum contact pads. The method includes a three step photoresist strip process which effectively removes photoresist from "keyholes" and other high step height structures while eliminating the corrosion problem. The three steps are (1) wet step, (2) F-containing gas plasma treatment step and (3) dry $O_2$ ash step.

The method begins by forming a metal layer 18 having a bonding pad area 32 over a semiconductor structure 10. A passivation layer 20 is then formed over said top metal layer 18. A photoresist pattern 34 having photoresist openings is formed over said passivation layer 20. The passivation layer 20 is dry etched forming a bond pad opening exposing said bonding pad area 32.

Now, the photoresist is removed using the invention's three step process: (1) wet photoresist strip, (2) F-containing plasma treatment, and (3) dry $O_2$ ash photoresist strip. To accomplish this, the wafer first is moved into a wet etch station. The photoresist layer is then wet etched. The wet cleaning preferably comprises at least an ACT690 wet clean and a DI clean. The substrate is placed into a spin dryer and spin dried. Second, the substrate is moved into an asher reactor and the substrate is treated with a F-containing gas (e.g., $CF_4$, $SF_6$, etc.) passivation treatment with the plasma power between 60 and 90 watts and for a time between about 10 and 120 seconds. In the third step, the remaining photoresist layer and etch by-products are then removed using an $O_2$ ashing process in the asher reactor.

Two major benefits of the three step photoresist strip process of the present invention are the elimination of corrosion and the removal of residual photoresist from keyholes.

The first major benefit of the invention is that the F-containing gas plasma treatment of the present invention removes any chloride ($Cl_2$) or other corrosive chemicals from the metal bonding pad after a first wet photoresist strip step. The F-containing gas plasma treatment prevents the corrosive chemicals from remaining on the wafer. Applicant has found that any minute concentrations of $Cl_2$ remaining on the wafer when it is processed through the $O_2$ plasma asher results in a severe corrosion problem. The high temperature asher process appears to activate the chlorine and corrode the metal layers. The F-containing gas plasma treatment step removes any trace amount of $Cl_2$ from the metal bonding pad to eliminate corrosion.

Second, the wet and dry photoresist strip steps (1 and 3) effectively remove photoresist from tight spaces (keyholes 23) between closely spaced, high profile metal lines. The wet strip (1) removes most of the photoresist from the surface, but small residual amounts of photoresist and chemical are left on the surface. The dry ash step (3) effectively removes the residual photoresist and chemicals.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. FIGS. 3A to 3C and 4 are cross sectional views of a semiconductor device explaining the method of preventing corrosion when stripping photoresist from a metal pad according to the present invention. As shown in the flow chart in FIG. 5, the invention uses a three step (see FIG. 5) photoresist (PR) stripping process. The three steps comprise (1) wet step, (2) F-containing gas plasma treatment, and (3) dry $O_2$ ash step.

The method begins by forming a first metal layer 18 (e.g., a top metal layer) over the semiconductor structure. The semiconductor structure can include a substrate and other conductive and passivation layers formed over the substrate as is known to those skilled in the art. See FIGS. 3A and 4. The first metal layer 18 can be formed of AMSi (aluminum silicon alloy), AlCu (aluminum cooper alloy), and AlSiCu (aluminum silicon cooper alloy) and is preferably formed of AlSiCu. The first metal layer 18 can have a thickness in the range from about 7000 to 9000 Å and more preferably a thickness of about 8000 angstroms.

Figure 3A:
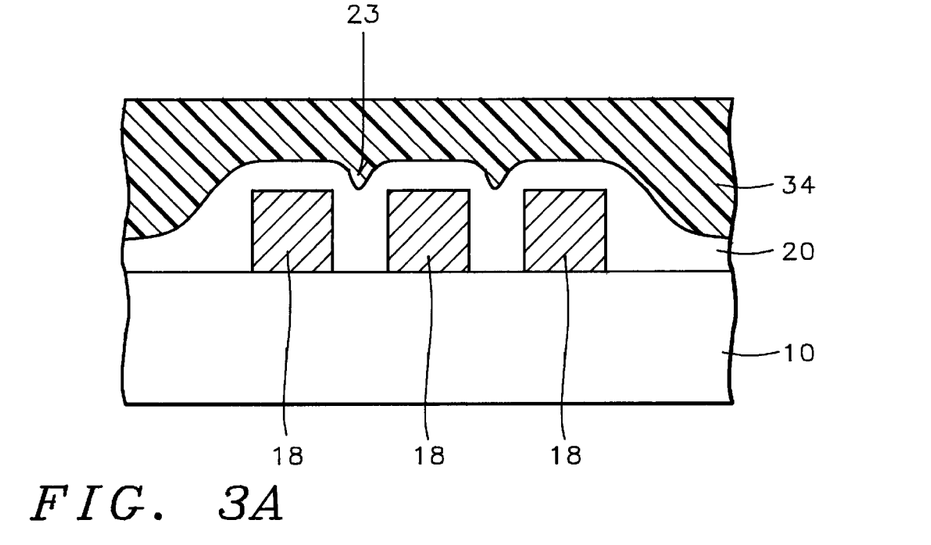
FIGS. 3A through 3C are cross sectional views for illustrating a method for removing photoresist over metal layers using the three step process of the present invention.
Figure 4:
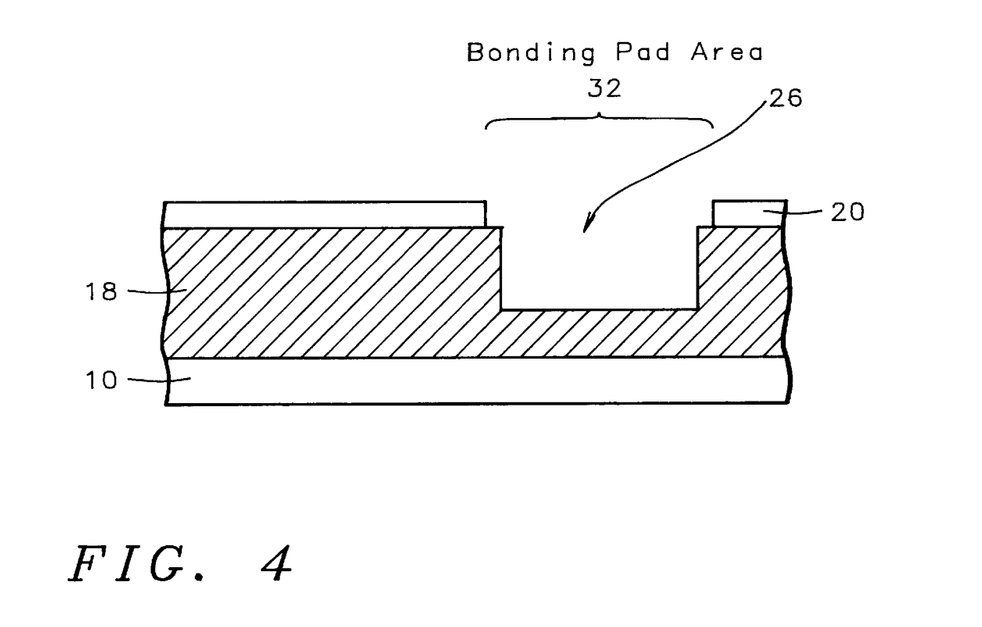
FIG. 4 is a cross sectional view for illustrating a method for cleaning a semiconductor substrate prior to an photoresist strip process by using the F-containing gas plasma treatment of the present invention and preventing the corrosion of aluminum contact pads.
Figure 5:
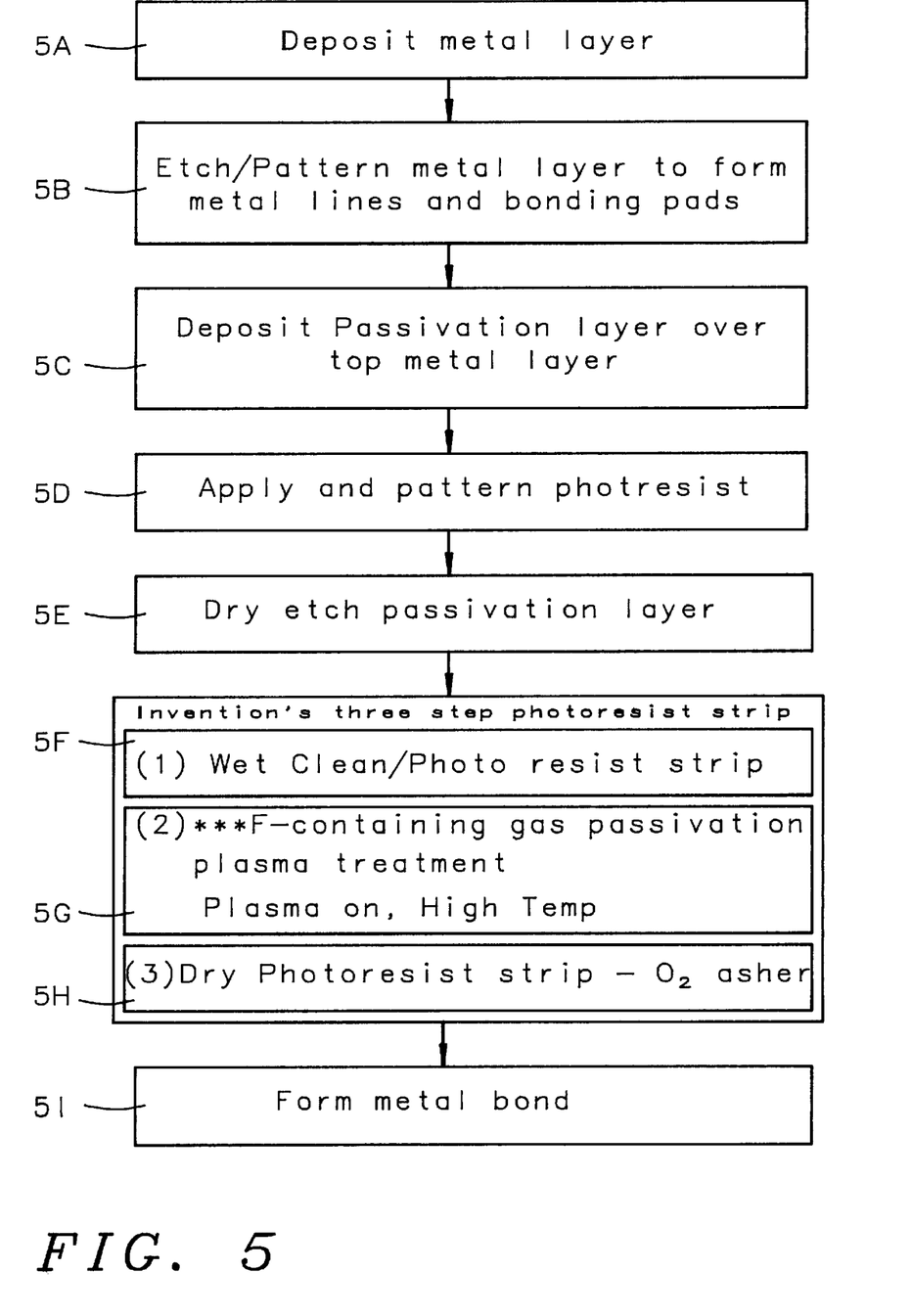
FIG. 5 is a flow chart of the wet and dry photoresist strip and F-containing gas passivation process of the present invention.

As shown in FIGS. 3A and 4, the first metal layer 18 is patterned to define a bonding pad 26 and groove 26.

Next, a first passivation layer 20 is formed over the substrate surface including the metal layer. The first passivation layer 20 can be formed of phosphosilicate glass (PSG), and silicon oxide and is preferably formed of silicon oxide. The silicon oxide layer 20 can be formed by decomposing Tetraethoxysilane (TEOS) or by other conventional deposition/oxidation processes. The first passivation layer has a thickness in the range of about 7000 to 9000 Å and more preferably a thickness of about 8000 Å.

In addition, the first passivation can be formed of a combination of dielectric layers, such as a silicon oxide layer and an overlying silicon nitride layer. The silicon nitride can be formed by conventional processes, such as a low pressure chemical vapor deposition, an ultraviolet nitride process or a plasma enhanced chemical vapor deposition (PECVD) process.

As shown in FIG. 3A, a photoresist layer 34 is formed over the substrate surface. The photoresist layer 34 has a first opening (not shown) over the bonding pad area. The photoresist can be made of a TSNR8700 photoresist by TOK company. Resist is coated on the upper surface of the wafer by spin coating. The coated resist is patterned by a photolithography process to form a bonding pad opening (photoresist opening) corresponding to a desired bonding pad configuration. The resist may be a positive type resist (novolak based resist), for example, OFPR-800 resist and TSMR series resist, such as TSMR-8900 manufactured by Tokyo Ohko Kogyo Co. Lt., Kawasaki, Kanagawa, Japan.

Next, the passivation layer 20 is etched through the opening in the photoresist layer 34. An opening 32 is formed though the passivation layers 20 22 over the bonding pad area 32 as shown in FIG. 4. The passivation layer 20 is preferably anisotropically etched using a RIE etch with a fluorine containing gas, such as $CF_4$—$H_2$, $C_2F_6$, $C_2F_6$—$C_2H_4$, $C_3F_8$, $C_4F_8$, or $CHF_3$. The passivation layer 20 is more preferably etched using Ar, $CF_4$, and $CHF_3$.

Next, the photoresist layer 34 is removed using the invention's three step process as shown in FIGS. 3A to 3C and FIG. 5.

In the first step, the photoresist layer 34 is substantially removed using a first wet strip. The wet photoresist strip can be performed by immersing the wafers in chemical step baths and DI water rinses followed by a spin dry. The photoresist layer 34 can be removed with photoresist wet removal strippers, such as EKC 265 (Hyroxylamine, $H_2O$, DCA (Diglycolamine and Catechol)) by E.K.C. company and EKC 830 (Digyucolamine and N-Methyl Pyrrolidone) by E.K.C. company.

In a preferred wet clean, which effectively removes polymer residues, the substrate surface is cleaned with an etchant including Dimethylsulfoxide (D.M.S.O.) and Monoethanolamine (M.E.A.) which can remove the polymer residue. Preferably the etchant, ACT 690C from Advanced Chemical Technologies Company is used. The wafers can be cleaned in a wafer cleaning tool manufactured by Kaiyo, with a flow rate in the range between about 15 to 25 liters per minute and at a temperature between about 100 to 120° C.

After the wet strip, the substrate 10 is placed into a spin dryer. The substrate is then spin dried. Our studies have shown that at this stage $Cl_2$ contaminates can be found in minute concentrations (about concentrations 20 PPB) on the wafer that cause Al corrosion. The $Cl_2$ might come from either the environment or from back-streaming of the spin dryer's exhaust lines. We have found that the $Cl_2$ is not originating form the previous RIE etch of the passivation layer (step 5B).

Figure 3B:
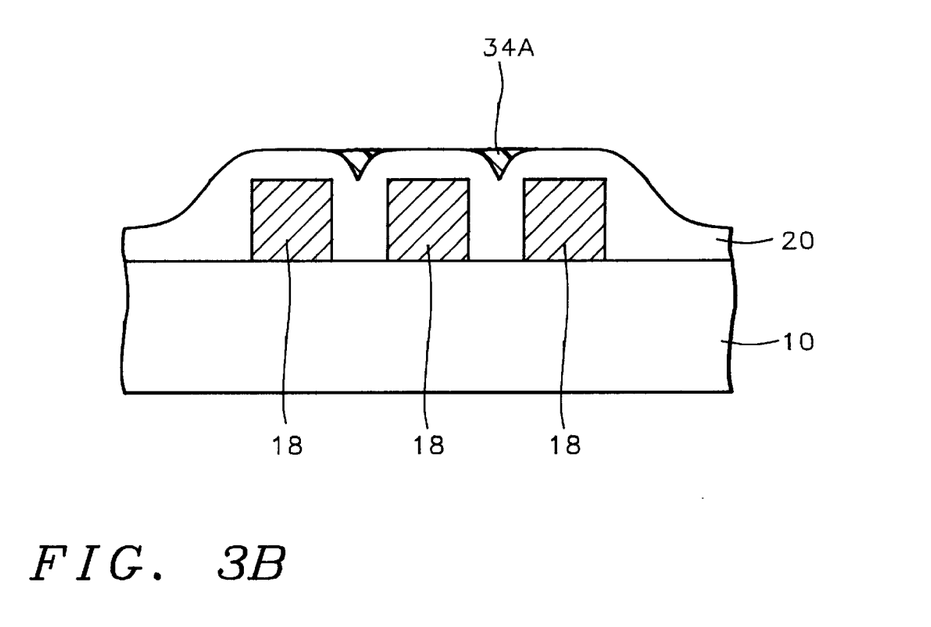
Figure 3C:
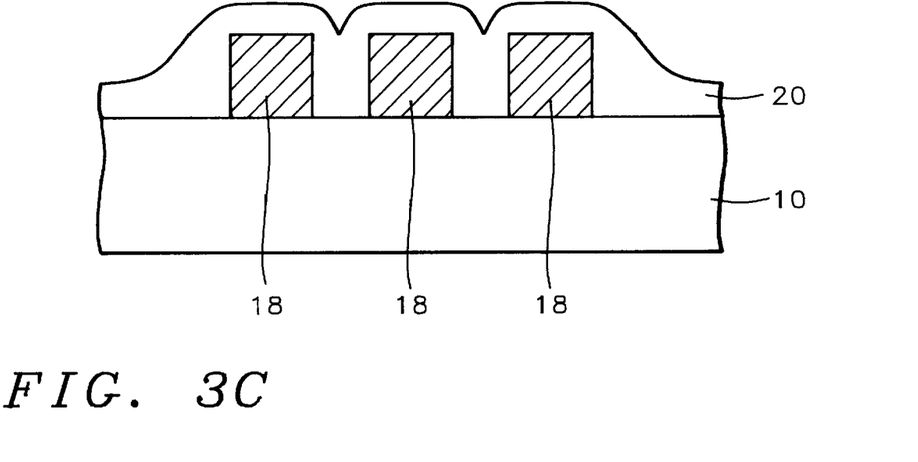

FIG. 3B shows the wafer after the spin dry. Residual photoresist 34A remains in the keyholes 23 and on other wafer surfaces.

Next, in an important step, the substrate is moved into a RIE etcher. The substrate surface is treated with a F-containing gas passivation treatment. The invention's F-containing gas plasma treatment removes any trace amounts of $Cl_2$ and other corrosive chemicals. The invention's F-containing gas plasma treatment is preferably performed with a fluorine containing gas, such as $CF_4$—$H_2$, $C_2F_6$, $C_2F_6$—$C_2H_4$, $C_3F_8$, $C_4F_8$, $CHF_3$ or $SF_6$ and more preferably with a $CF_4$ at gas flow rate between about 80 and 120 sccm, at a plasma power between 60 and 90 W and at temperature between −10 and 25° C. and for a time between about 10 and 120 seconds and more preferably between about 15 and 25 seconds.

TABLE 1

Preferred Process Variables For The $CF_4$ Plasma Treatment Of The Invention

| Variable | units | low limit | target | hi limit |
| --- | --- | --- | --- | --- |
| Power | Watts | 60 | 75 | 90 |
| Pressure | mtorr | 800 | 880 | 1000 |
| $CF_4$ | SCCM | 80 | 100 | 120 |
| Gap | mm | 1 | 1.2 | 1.5 |
| Time | sec | 10 | 20 | 120 |

It is theorized that the F-containing gas from the plasma treatment replaces $Cl_2$ on the bonding pad metal. It is critical to remove the $Cl_2$ at this stage before the next step (dry $O_2$ ashing). The $Cl_2$ remaining on the bond pad surface will react with the metal under the high temperature $O_2$ ash process and corrode the bonding pad. It has been confirmed that the corrosive reaction will not occur without the $O_2$ dry plasma strip (Ashing) even with excessive amounts of $Cl_2$ on the bonding pad surfaces. The results indicate that that the $O_2$ plasma treatment provides the activation energy for the corrosion reaction (See table 2 below).

In the third step in the photoresist strip process of the invention, the photoresist layer 16 is completely removed, including residual photoresist 34A in the keyholes, using an $O_2$ ashing treatment in the asher reactor. See FIG. 3C. The ashing process is performed to remove the resist layer 16 and the by-products generated during the etching process.

The oxygen plasma dry strip can be performed insitu in an etcher by PSC for a time between about 10 to 20 seconds minutes, at a temperature between about 130 and 210° C. and more preferably between about 190 and 210° C., and more preferably of about 200° C., at a pressure between about 500 to 1000 mTorr and a power between 60 and 90 watts. The oxygen treatment removes some of the chemicals and photoresist over the resultant surface and in any the keyholes. The oxygen plasma treatment is important because if the photoresist etchant (e.g., ACT) is not removed from the surface, the photoresist etchant (ACT) will evaporate and concentrate in the end point of the metal spacing during the alloy step, thus causing metal failures. The high $O_2$ plasma temperature is theorized to be important in creating the corrosion.

Following this, a metal bond is formed in the bonding pad according to conventional process well known to those in the art.

Experiments were conducted to determine at what stage the corrosion of the bonding pad occurred and to test the effectiveness of the F-containing gas plasma treatment of the invention. Table 2 below shows the pad corrosion as a function of queue time and process stage. The pad corrosion become worse with additional queue time and worst after the wet stripping and $O_2$ ashing step. To quantify the pad corrosion, 5 sites per wafer and 4 chips per sited were measured. The degree of pad corrosion is defined as follows:

1: 1 to 2 dies (fails) in one site
3: 1 to 2 dies in 2 to 3 sites
5: 1 to 2 dies in 5 sites

TABLE 2

Pad corrosion vs queue time at different photoresist etch stages

| Stage | Dry etch of the Al layer (step 5B) | wet stripping of the Photoresist (Step 5F) | $O_2$ Ashing of the photoresist (Step 5H) |
| --- | --- | --- | --- |
| equipment | RIE -- BP4520P-A | Wet station - BPRS-3 | $O_2$ asher - BPSC-3 |
| 5 hours | 0 | 0 | 1 |
| 20 hours | 0 | 1 | 3 |
| 48 hours | 0 | 3 | 5 |

The high effectiveness of the F-containing gas plasma treatment of the present invention at preventing corrosion is shown below in Table 3.

TABLE 3

Pad corrosion as a function of queue time and $CF_4$ gas treatment

| Stage | equipment | Applicant's Previous method | process of the invention |
|---|---|---|---|
| passivation dry etch (step 5E) | B4520P-A | Yes | yes |
| Wet stripping (step 5F) | Wet station and spin dry BPRS-3 | yes | yes |
| $CF_4$ passivation treatment of the invention (Step 5G) | RIE tool B4520-18 | no***** | yes |
| $O_2$ ashing - PR strip (Step 5H) | PSC tool BPSC-3 | yes | yes |
| Queue | 8 hours | 3 - degree of corrosion | 0 - degree of corrosion |
|  | 24 hours | 5 - degree of corrosion | 1 - degree of corrosion |

Table 3 shows that the F-containing ($CF_4$) passivation treatment is effective is prevention aluminum bonding pad corrosion. The experimental data show that the anticorrosion queue time for the wafers treated with the $CF_4$ plasma gas (step 5G) prior to (step 5H) $O_2$ ashing area approximately 24 hours compared with the queue time of less than 1 hour for the standard $O_2$ ashing process.

Figure 6:
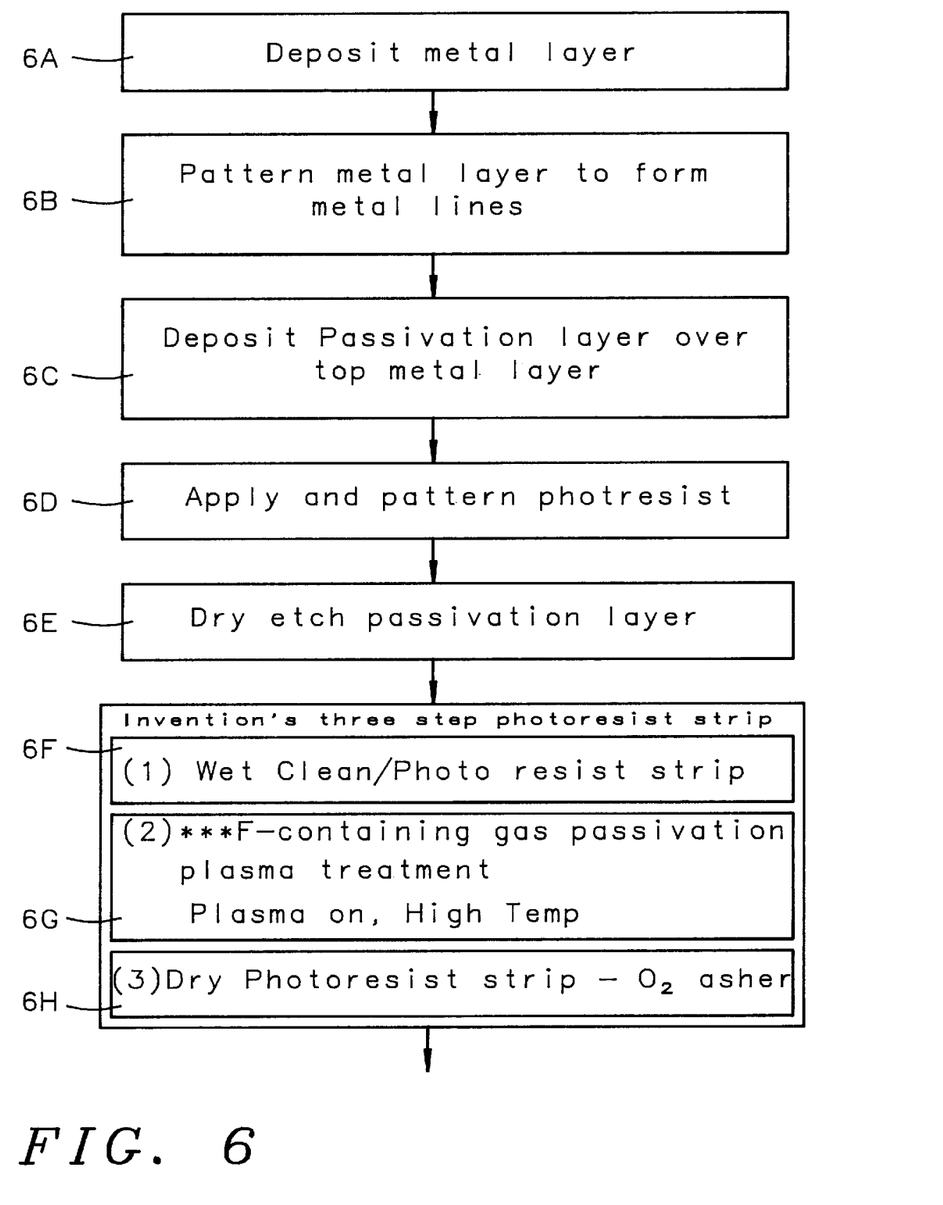
FIG. 6 is a flow chart of three step photoresist strip process of the invention applied after a metal etch.

The F-containing plasma treatment of the invention can be used after any metal/passivation layer photoresist strip process where a wet photo resist strip is followed by a dry photo strip (e.g., $O_2$ ashing) to prevent corrosion of the metal layer. For example, the invention can be applied after the patterning of metal lines and dielectric layers as shown in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method of preventing corrosion of an aluminum bonding pad layer after a wet and dry photoresist strip process comprising:

a) forming a metal layer composed of an aluminum alloy having a bonding pad area over a semiconductor structure;

b) forming a passivation layer over said top metal layer;

c) forming a photoresist layer having photoresist openings over said passivation layer; said photoresist opening over said bonding pad area;

d) etching said passivation layer forming a bond pad opening exposing said bonding pad area; the etching of said passivation layer is performed using a halogen containing gas;

e) performing a wet photo resist strip to remove said photoresist layer;

f) performing a F-containing gas plasma treatment on said substrate; and g) removing a photoresist layer residue using an $O_2$ ashing process.

2. The method of claim 1 wherein the F-containing, gas plasma treatment is performed with a fluorine containing gas selected from the group consisting of $CF_4$—$H_2$, $C_2F_6$, $C_2F_6$—$C_2H_4$, $CF_3F_8$, $C_4F_8$, $CHF_3$, and $SF_6$.

3. The method of claim 1 wherein the F-containing gas plasma treatment is performed by: placing said substrate into an asher reactor performing, the F-containing gas plasma treatment at a $CF_4$ gas flow rate between about 80 sccm and 120 sccm, a plasma power between 60 and 90 watts, and at temperature between −10 and 25° C.; and for time in a range of between about 10 and 120 seconds.

4. The method of claim 1 wherein the removal of said photoresist in the ashing process comprises dry etching said photoresist layer in said asher reactor using a $O_2$ containing gas at a temperature in a range of between about 190 and 210° C.

5. The method of claim 1 wherein said passivation layer is comprised of silicon oxide having a thickness in a range of between about 7000 and 9000 Å.

6. The method of claim 1 wherein the performing a wet photo resist strip to remove said photoresist layer comprises: conducting at least a Dimethylsulfoxide (D.M.S.O.) and Monoethanolamine (M.E.A.) wet clean and a DI clean; and placing said substrate into a spin dryer, and spin drying said substrate.

7. A method of preventing corrosion of an aluminum bonding pad layer after a wet and dry photoresist strip process comprising:

a) forming a metal layer comprised of an aluminum alloy having a bonding pad area over a semiconductor structure;

b) forming a passivation layer comprised of silicon oxide over said top metal layer;

c) forming a photoresist pattern having photoresist openings over said passivation layer;

d) etching said passivation layer forming a bond pad opening exposing said bonding pad area; the etching of said passivation layer performed using a chlorine containing gas;

e) performing a wet photo resist strip to remove said photoresist layer;

f) placing said semiconductor structure into asher reactor performing a F-containing gas plasma treatment at a $CF_4$ gas flow rate between about 80 sccm and 120 sccm, a plasma power between 60 and 90 watts, and at temperature between −10 and 25° C.; and for time in a range of between about 10 and 120 seconds;

g) removing said photoresist layer using an $O_2$ ashing treatment in said asher reactor at a temperature in a range of between about 130 and 210° C.

8. The method of claim 7 wherein said metal layer comprised of an aluminum alloy consisting of Al, Cu, and Si.

9. The method of claim 7 wherein the performing a wet photo resist strip to remove said photoresist layer comprises:

conducting at least a Dimethylsulfoxide (D.M.S.O.) and Monoethanolamine (M.E.A.) wet clean and a DI clean; and placing said substrate into a spin dryer, and spin drying said substrate.

10. The method of claim 7 wherein said passivation layer is comprised of silicon oxide having a thickness in a range of between about 7000 and 9000 Å.

11. The method of claim 7 wherein the removal of said photoresist layer using said $O_2$ ashing treatment occurs in said asher reactor at a temperature in a range of between about 190 and 210° C.

12. A method of preventing corrosion of an aluminum layer by an $O_2$ plasma photoresist strip comprising:

a) applying a photoresist layer onto an aluminum layer over a substrate;

b) placing said substrate in a reactive ion etcher and dry etching said aluminum layer in a reactive ion etcher; the dry etching performed using a Chlorine gas mixture;

c) wet cleaning said aluminum layer by performing a wet photo resist strip to remove said photoresist layer;

d) treating the substrate with a F-containing gas passivation treatment with the plasma power between 60 and 90 Watts and at temperature between −10 and 25° C.; and e) removing a photoresist layer residue using an $O_2$ ashing treatment in said asher reactor.

13. The method of claim 12 wherein the F-containing gas plasma treatment is performed with a fluorine containing gas selected from the group consisting of $CF_4$—$H_2$, $C_2F_6$, $C_2F_6$—$C_2H_4$, $C_3F_8$, $C_4F_8$, $CHF_3$, and $SF_6$.

14. The method of claim 12 wherein the F-containing gas plasma treatment is performed by: placing said substrate into an asher reactor, performing the F-containing gas plasma treatment at a F-containing gas flow rate between about 80 sccm and 120 sccm, a plasma power between 60 and 90 watts, and at temperature between −10 and 25° C.; and for time in a range of between about 10 and 120 seconds.

15. The method of claim 12 wherein the F-containing gas plasma treatment is performed by: placing said substrate into an asher reactor, performing the F-containing gas plasma treatment at a $CF_4$ gas flow rate between about 80 sccm and 120 sccm, a plasma power between 60 and 90 watts, and at temperature between −10 and 25° C.; and for time in a range of between about 10 and 120 seconds.

16. The method of claim 12 wherein the removal of said photoresist layer using said $O_2$ ashing treatment in said asher reactor occurs at a temperature in a range of between about 190 and 210° C.

17. The method of claim 12 wherein step c further includes the performing the wet photo resist strip to remove said photoresist layer comprises: conducting at least a Dimethylsulfoxide (D.M.S.O.) and Monoethanolamine (M.E.A.) wet clean and a DI clean; and placing said substrate into a spin dryer, and spin drying said substrate.

* * * * *